United States Patent
Vinh

(10) Patent No.: US 6,407,585 B1
(45) Date of Patent: Jun. 18, 2002

(54) METHOD AND APPARATUS FOR A FAMILY OF SELF CLOCKED DYNAMIC CIRCUITS

(75) Inventor: James Vinh, San Jose, CA (US)

(73) Assignee: Fujitsu Ltd., Kanagawa-ken (JP)

( * ) Notice: Subject to any disclaimer, the term of this patent is extended or adjusted under 35 U.S.C. 154(b) by 0 days.

(21) Appl. No.: 09/502,180

(22) Filed: Feb. 10, 2000

(51) Int. Cl.$^7$ ............................................... H03K 19/96
(52) U.S. Cl. ........................... 326/98; 326/28; 326/112
(58) Field of Search ............................. 326/93, 95, 98, 326/119, 121, 112, 26–28

(56) References Cited

U.S. PATENT DOCUMENTS

| | | | |
|---|---|---|---|
| 3,935,474 A | * 1/1976 | Komarek | 326/119 |
| 5,208,489 A | 5/1993 | Houston | |
| 5,828,234 A | * 10/1998 | Sprague | 326/98 |
| 5,880,986 A | 3/1999 | Dedhia | 364/784.05 |
| 6,002,271 A | * 12/1999 | Chu et al. | 326/121 |
| 6,104,212 A | * 8/2000 | Curren | 326/112 |
| 6,163,173 A | * 12/2000 | Storino et al. | 326/98 |
| 6,169,422 B1 | * 1/2001 | Harris et al. | 326/98 |

\* cited by examiner

Primary Examiner—Don Phu Le

(74) Attorney, Agent, or Firm—Fenwick & West, LLP

(57) ABSTRACT

A new self clocking family of dynamic logic gates which replace footless or subsequent stage dynamic logic gates in multi-stage domino logic circuits. In a preferred embodiment, a multi-stage logic circuit is designed having a first stage which utilizes a traditional dynamic logic gate and a second stage which includes a new self-clocking dynamic logic gate. The output from the first stage is coupled to the input of the second stage such that the second stage is not dependent upon any type of clock signal for precharging. Instead, the second stage includes a dual transistor arrangement on the inter-stage inputs (i.e. the outputs from one stage which are input to subsequent stages) in order to precharge the output node at the second stage such that no type of clock signal is needed during precharge. Accordingly, the output from the second stage is efficiently precharged without using a delayed clock signal or any customized delay circuitry while minimizing through current by design. This allows the multi-stage domino logic circuit to be designed with lower power consumption since through current is minimized by design. The second stage further includes a noise/leakage circuit at each of the inputs to the second stage. The noise/leakage circuit is designed to ensure a stable and accurate output from the new self-clocking dynamic logic circuit until the inputs to that stage are valid. The noise/leakage circuit also protects against any improper operation which may be caused by any noise on the input lines.

18 Claims, 2 Drawing Sheets

METHOD AND APPARATUS FOR A FAMILY OF SELF CLOCKED DYNAMIC CIRCUITS

FIELD OF THE INVENTION

The invention generally relates to dynamic logic circuits. More particularly, the invention relates to a new family of self-clocked dynamic logic gates.

BACKGROUND OF THE INVENTION

A static logic gate is a fully complementary logic gate having both PMOS and NMOS devices configured to implement a desired function. Typically, each NMOS device is accompanied by a corresponding PMOS device. In this way, a static CMOS gate is expensive to implement and requires significant die space.

A dynamic logic gate consists of a structure having a single output node and any number of NMOS devices coupled to the output node for conditionally discharging the output node to a low voltage rail Vss depending upon inputs to the NMOS devices. A dynamic logic gate also includes at least one PMOS device which is coupled to the output node for precharging the output node to a high voltage rail Vcc. The PMOS device has a gate coupled to a clock signal, a source coupled to the high voltage rail and a drain coupled to the output node. When the clock signal is low, the PMOS device is turned on and the output node is precharged and driven to the high voltage rail Vcc. When the clock signal is high, the logic gate is evaluated. If the inputs which are coupled to the gates of the NMOS transistors become high, the output node is conditionally discharged (evaluated) through the NMOS devices to the low voltage rail Vss.

A conventional dynamic logic circuit usually includes multiple dynamic logic gates which are arranged in a plurality of stages, wherein the operation of each gate in the unit is controlled by the clock signal and the outputs from the prior stage. In this arrangement, input signals applied to a first stage while the clock signal is active trigger operation of the remaining stages in sequence, yielding a domino-like signal propagation through the conventional dynamic logic circuit. Hence, the term "domino" logic is often used in describing such circuits. In a conventional "domino" logic circuit each of the stages are coupled to the clock signal and are precharged when the clock signal is low.

FIG. 1 illustrates a domino logic circuit having a first stage dynamic AND gate coupled to a second stage NAND gate. The first stage dynamic AND gate is designated by the broken lines 100 and the second stage dynamic NAND gate is designated by the broken lines 200 in FIG. 1. The first stage dynamic AND gate 100 includes a PMOS transistor 110 having a gate coupled to a clock signal CLK, a source coupled to a high voltage rail $V_{DD}$, and a drain coupled to an output node 120. The drain of the PMOS transistor 110 is also coupled to a drain of first NMOS transistor 130. A gate of the first NMOS transistor 130 is coupled to receive an input signal A and a source of first NMOS transistor 130 is coupled to a drain of a second NMOS transistor 140. A gate of the second NMOS transistor 140 is coupled to receive an input signal B and a source of the second NMOS transistor 140 is coupled to a drain of a third NMOS transistor 150. A gate of the third NMOS transistor 150 is coupled to receive the clock signal CLK and a source of the third NMOS transistor 150 is coupled to a low voltage rail Vss. The output node 120 is coupled to an input of an inverter 160, having an output $O_1$. The output $O_1$ is the output from the first stage dynamic AND gate 100.

In operation, when the clock signal CLK is inactive (low), then the PMOS transistor 110 is on and the third NMOS transistor 150 is off. In this state, the output node 120 is precharged to the high voltage rail $V_{DD}$ and the output $O_1$ of the inverter 160 is driven low. Accordingly, the output $O_1$ from the first stage dynamic AND gate 100 is initially driven low during precharge between each evaluate cycle. When the clock signal goes active (high), the PMOS transistor 110 turns off and the third NMOS transistor 150 turns on. This allows the voltage at the output node 120 to be evaluated or selectively discharged depending upon the inputs A and B. If the voltages at the inputs A and B are both high, then both the first and second NMOS transistors 130 and 140 will turn on. When this occurs, the voltage at the output node 120 drops to the low voltage rail Vss and the output $O_1$ of the inverter 160 is driven high. If only one of the inputs A or B is high, while the other is low, then both the first and second NMOS transistors 130 and 140 will not turn on (only one of the transistors will turn on while the other will remain off), in which case the voltage at the output node 120 will remain at the high voltage rail $V_{DD}$ and the output $O_1$ from the inverter 160 will remain low. Accordingly, only when the voltages at both inputs A and B are both high during the evaluate cycle will the output from the inverter 160 be driven high.

The first stage dynamic AND gate 100 also, optionally, includes a feedback circuit which is designated by the broken lines 170 in FIG. 1. The feedback circuit 170 is comprised of a PMOS transistor 180 having a source coupled to the high voltage rail $V_{DD}$, a drain coupled to the output node 120, and a gate coupled to the output $O_1$ of the inverter 160. Over time, the precharge voltage at the output node 120 may drop due to leakage of through current which may be caused if noise at the inputs A and B inadvertently activate the NMOS transistors 130 and 140. If the voltage at the output node 120 were to drop below a certain level due to leakage of through current through transistors 130, 140 and 150, this would cause the output $O_1$ at the inverter 160 to change to a "false" high, thereby effecting the entire circuit. The feedback circuit 170 is used to keep the voltage at the output node 120 stable until the inputs are all valid, thereby ensuring that the voltage at the output $O_1$ of the inverter 160 remains low until the inputs A and B are both high.

As indicated earlier, in the domino logic shown in FIG. 1, a second stage dynamic NAND gate 200 is coupled to the first stage dynamic AND gate 100. The second stage dynamic NAND gate 200 includes a PMOS transistor 210 having a gate coupled to the output of a delay circuit 280, a source coupled to the high voltage rail $V_{DD}$, and a drain coupled to an output node 220. Typically, the delay circuit 280 is designed to receive the incoming clock signal CLK and delay the falling edge of the incoming clock signal CLK during the precharge phase. The falling edge of the clock signal is delayed a sufficient period of time until the output $O_1$ from the first stage dynamic AND gate 100 is switched low (the output $O_1$ from the first stage dynamic AND gate is switched low once the voltage at node 120 has been sufficiently precharged toward the high voltage rail $V_{DD}$ (thereby activating the inverter 160 and inverting the voltage at the output node $O_1$ back toward the low voltage rail Vss.

The drain of the PMOS transistor 210 is also coupled to a drain of an NMOS transistor 230. A gate of the NMOS transistor 230 is coupled to receive the output $O_1$ from the first stage dynamic AND gate 100 and a source of the NMOS transistor 230 is coupled to a drain of an NMOS transistor 240. A gate of the NMOS transistor 240 is coupled to receive an input signal C and a source of the NMOS transistor 240 is coupled to the low voltage rail. It is noted that the second stage is commonly referred to as a "footless" dynamic logic circuit since no additional clock controlled NMOS transistor is utilized during the evaluate cycle.

During the precharge stage, the delayed clock signal CLK' is inactive and, the PMOS transistor 210 is active, thereby precharging the voltage at node 120 to the high voltage rail $V_{DD}$. During evaluation, if the output $O_1$ from the first stage AND gate 100 is high and the input C to the second stage NAND gate 200 is also high, then both NMOS transistors 230 and 240 turn on. When this occurs the voltage at the output node 220 drops to the low voltage rail Vss. However, if during evaluation only one of either the output $O_1$ from the first stage AND gate 100 or the input C is high, while the other is low, then both NMOS transistors 230 and 240 will not turn on (only one of the transistors will turn on while the other will remain off), in which case the voltage at the output node 220 will remain at the high voltage rail $V_{DD}$. Accordingly, only when the output $O_1$ from the first stage AND gate 100 and the input C are both high will the output $O_2$ from the second stage NAND gate 200 be driven low during the evaluation stage, in all other cases it will remain high during the evaluation stage.

As can be seen from the conventional domino logic circuit shown in FIG. 1, implementation of traditional dynamic "domino" logic circuitry poses several problems. First, the falling edge of the clock signal CLK must be delayed during the precharge phase, in order to save power by cutting down through current. If the clock signal CLK is not delayed then wasted through current may occur. If the falling edge of the clock signal were not delayed and the clock signal was coupled directly to the gate of transistor 210 in the second stage NAND gate 200, then when the clock signal CLK went low the transistor 210 would turn on. This might occur before node 120 is sufficiently precharged to activate inverter 160. Accordingly, if the output $O_1$ from the first stage AND gate 100 was previously high, it will remain high until the node 120 is fully precharged. If the input C is also driven high before node 120 is fully precharged then there will be a current path from Vdd to Vss through transistors 210, 230 and 240. This is a waste of current and power. This may occur until the output $O_1$ from the first stage CMOS AND gate 100 is driven low once node 120 is sufficiently precharged and inverter 160 is activated. Accordingly, the delay logic is needed to delay the falling edge of the delayed clock signal CLK' until the output $O_1$ from the first stage CMOS AND gate 100 is switched low during precharge.

The amount of delay required may vary from circuit to circuit and must be custom designed to meet specific circuit characteristics. This adds increased costs to the manufacture of most domino logic families. Moreover, because performance characteristics may vary over time, these customized delay circuits may not always operate reliably (i.e., the delay associated with the delay circuit may vary over time as operating conditions change). Accordingly, what is needed is a new dynamic logic circuit wherein subsequent stages in the circuit design are not dependent upon a delayed clock signal for precharging so there is no need to custom design delay circuits between stages.

Additionally, the amount of power required to drive a circuit having multiple stages is proportional to the load capacitance and the switching frequency of each stage in the circuit. Because each stage in a conventional domino logic circuit is connected to the clock signal (which has the highest frequency of any signal in the circuit) in order to precharge the output from that stage during the precharge phase, as the number of stages increases the load capacitance seen by the clock signal increases and the circuit design requires increased power in order to operate. Accordingly, what is needed is a circuit design which has a lower load capacitance seen by the clock signal and which does not require each stage to be coupled to a clock signal for precharging—i.e. where the precharging of each stage is not dependent upon any clock signal.

A major concern when it comes to dynamic logic circuit design is noise. For example, if the outputs from a first stage in a conventional domino logic design transmit noise and are used as inputs to a next stage, the output from the next stage may inadvertently be erroneously discharged before the actual inputs to any stage are actually valid. One traditional way of minimizing this effect between stages is to shield the coupling between stages or buffer the inputs/outputs between stages using a pair of static CMOS inverters. However, this increases overall manufacturing and production costs. Moreover, buffering the inputs and outputs between stages results in additional delay time as the signal passes through the buffer, which, in turn, causes the chip to operate at a lower frequency. Accordingly, what is needed is a new dynamic logic family which is able to perform reliably even in the presence of significant noise at the output/inputs between stages and does not suffer the speed loss as in the case of using a buffer at each of the inputs/outputs.

SUMMARY OF THE INVENTION

The invention is for a new self clocking family of dynamic logic gates which replace footless or subsequent stage dynamic logic gates in multi-stage domino logic circuit.

In one embodiment of the present invention, a multiple stage logic circuit is designed having a first stage which utilizes a traditional dynamic logic gate design and a second stage which includes a new self-clocking dynamic logic gate design. The output from the first stage is coupled to the input of the second stage such that the second stage is not dependent upon any type of clock signal for precharging. Instead, the second stage includes a new self clocking dynamic logic gate design which utilizes a dual transistor arrangement on the inter-stage inputs (i.e. the outputs from one stage which are input to subsequent stages) in order to precharge the output node at the second stage such that no delayed clock signal is needed during precharge.

Accordingly, the output from the second stage which is designed in accordance with the new family of self-clocking dynamic logic gates is efficiently precharged without using a delayed clock signal or any customized delay circuitry while minimizing through current by design. This allows the multi-stage domino logic circuit to be designed with lower power consumption since through current is minimized by design. Instead of using a delayed clock signal in precharge between stages. The output from the previous stage is used to activate the subsequent stage in both precharge and evaluate. Each self-clocking dynamic logic gate designed in accordance with the present invention includes an NMOS and PMOS transistor pair which each share a common output node. By coupling the output from the previous stage to the gates of both the PMOS and NMOs device, one may be activated during precharge while the other is deactivated. Thereby inhibiting any direct path to the low voltage rail Vss and reducing through current by design.

In a second embodiment of the present invention, a multiple stage domino logic circuit is designed having a first stage which utilizes a traditional dynamic logic gate design and a second stage which utilizes a new self clocking dynamic logic gate design which is not dependent upon any delayed clock signal. The second stage further includes a noise/leakage circuit at each of the inputs. The noise/leakage circuit is designed to ensure a stable and accurate output from the new self-clocking dynamic logic circuit until the inputs to that stage are valid. The noise/leakage circuit also protects against any improper operation which may be caused by any noise on the input lines.

In a third embodiment of the present invention, multiple self-clocking dynamic logic gates may be implemented within a single domino logic circuit design with their individual outputs summed in order to perform any desired combinational logic circuitry function.

DESCRIPTION OF THE DRAWINGS

The present invention has other advantages and features which will be more readily apparent from the following detailed description of the invention and the appended claims, when taken in conjunction with the accompanying drawings, in which:

DETAILED DESCRIPTION OF PREFERRED EMBODIMENT

The present invention includes a new family of self-clocking dynamic logic gates which may be coupled as subsequent stages to any first stage conventional dynamic logic gate and which operate without using a delayed clock signal for precharging. Because domino logic circuits which include this new family of dynamic logic do not require any form of delayed clock signal for precharging, design costs and considerations are made simpler and power consumption is minimized by having less clock loading within the domino logic circuit.

The new family of self-clocking dynamic logic gates each preferably include a noise/leakage prevention circuit at the inputs in order to protect from noise, thereby allowing for a high noise tolerance, which when compared to that of static CMOS circuits significantly limits the effects of noise in corrupting the output of a circuit.

Further, many different domino logic circuit designs and integrated functions may be realized utilizing any combination of traditional dynamic logic gates and self-clocking dynamic logic gates designed in accordance with the new self-clocking logic family.

Figure 2:
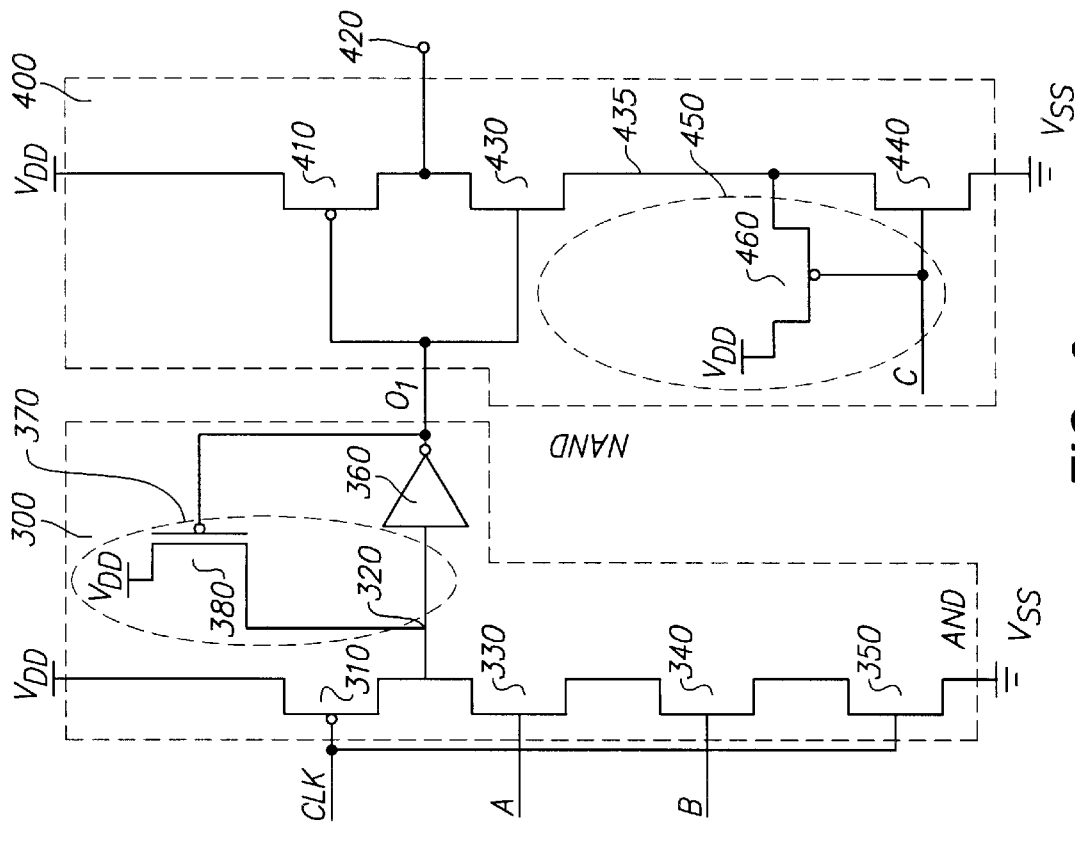
FIG. 2 illustrates a two stage domino logic circuit which includes a dynamic self-clocking logic gate in accordance with a preferred embodiment of the present invention.

FIG. 2 illustrates a first stage conventional dynamic logic AND gate 300 coupled to a second stage self-clocking dynamic logic NAND gate 400 designed in accordance with the present invention. It is understood that the domino logic circuit shown in FIG. 2 is merely illustrative of the types of logic functions which may be implemented using a conventional dynamic logic gate in conjunction with a second stage self-clocking dynamic logic gate designed in accordance with the present invention. More importantly, FIG. 2 illustrates how a self-clocking dynamic logic gate may be designed and coupled to a conventional dynamic logic gate without requiring any clock timing delay circuitry for precharging the self-clocking dynamic logic gate, thereby minimizing power consumption and wasted through current.

Figure 1:
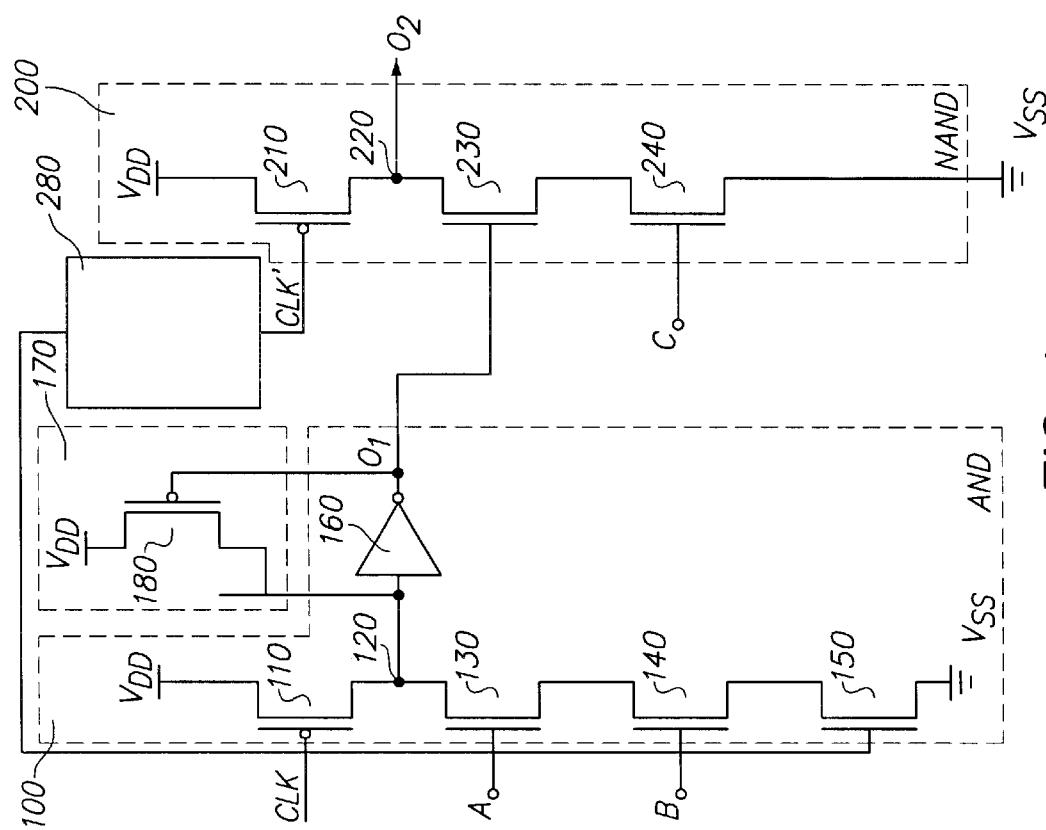
FIG. 1 illustrates a prior art two stage dynamic logic circuit.

As shown in FIG. 2, a conventional dynamic logic AND gate 300 is designed in accordance with the conventional principles as illustrated and discussed with reference to the prior art illustrated in FIG. 1. Accordingly, the conventional AND gate 300 includes a PMOS transistor 310 having a gate coupled to receive a clock signal CLK, a source coupled to a high voltage rail $V_{DD}$, and a drain coupled to an output node 320. The high voltage rail $V_{DD}$ is preferably held at a voltage level between 1.3 and 5 volts. The drain of the PMOS transistor 310 is also coupled to the drain of an NMOS transistor 330. The gate of the NMOS transistor 330 is coupled to receive an input signal A and the source of the NMOS transistor 330 is coupled to a drain of an NMOS transistor 340. The gate of the NMOS transistor 340 is coupled to receive an input signal B and the source of the NMOS transistor 340 is coupled to a drain of an NMOS transistor 350. The gate of NMOS transistor 350 is coupled to receive the clock signal CLK and the source of the NMOS transistor 350 is coupled to a low voltage rail Vss. The low voltage rail Vss is preferably held at a voltage level between 0 and 0.15 volts. The output node 320 is coupled to an input of an inverter 360, having an output O. The voltage level at the output O from the inverter 360 is the voltage output from the conventional dynamic logic AND gate 300.

In discussing the operation of the conventional dynamic logic AND gate 300 of FIG. 2, it is understood that a voltage level between X1 and X2 volts is hereinafter referred to as a logic high voltage and a voltage level between X3 and X4 is hereinafter referred to as a logic low voltage. Additionally, the clock signal CLK is referred to as being either active or inactive.

In operation, when the clock signal CLK is inactive, then the PMOS transistor 310 is turned on and the NMOS transistor 350 is turned off. In this state, a voltage level measured at the output node 320 is precharged to a logic high voltage (i.e., toward the voltage level of the high voltage rail $V_{DD}$), and the voltage level at the output O of the inverter 360 is, accordingly, driven to the inverse or a logic low voltage. When the clock signal goes active, the PMOS transistor 310 turns off and the NMOS transistor 350 turns on. If the input signals A and B are both at logic high voltages, then both NMOS transistors 330 and 340 will turn on. If this occurs the voltage level at the output node 320 drops to a logic low voltage (i.e., is driven toward the voltage level of the low voltage rail Vss) and the voltage level at the output O of the inverter 360 is inverted toward the logic high voltage.

If only one of the input signals A or B is at a logic high voltage, while the other is at a logic low voltage, then both NMOS transistors 330 and 340 will not turn on (only one of the NMOS transistors 330 or 340 will be turned on while the other will remain off), in which case the voltage level at the output node 320 will remain at the logic high voltage level (i.e., it will continue to be driven high by the voltage at the high voltage rail $V_{DD}$) and the voltage level at the output O from the inverter 360 will remain at a logic low voltage. Accordingly, only when the input signals A and B are both at logic high voltage levels will the voltage level at the output O from the conventional dynamic logic AND gate 300 be driven toward a logic high voltage.

Optionally, the conventional AND gate 300 shown in FIG. 2 includes a feedback circuit which is designated by the broken lines 370 in FIG. 2. The feedback circuit 370 is comprised of a PMOS transistor 380 having a source coupled to the high voltage rail $V_{DD}$, a drain coupled to the output node 320, and a gate coupled to the output O from the inverter 360. The precharge voltage accumulated at the output node 320 may drop due to leakage of through current through the transistors 330, 340 and 350. This may occur if noise appears at either of the inputs A and B before the conventional AND gate 300 has fully precharged. If the voltage level at the output node 320 drops below a certain level, the circuit may operate under a "false" change from a logic high voltage to a logic low voltage. In other words, the inverter 360 may treat the voltage level at its input as a logic low voltage and the output O at the inverter 360 may change to a "false" high, thereby affecting the entire circuit. The feedback circuit 370 is used to keep the voltage level at the output O from the inverter 360 stable, by maintaining the precharged voltage level at the output node 320 at the logic high voltage until the input signals A and B are valid.

FIG. 2 also shows a new self-clocking dynamic NAND gate 400 designed in accordance with the present invention. This self-clocking dynamic NAND gate 400 is coupled to the output O from the inverter 360 of the conventional dynamic logic AND gate 300. However, unlike the footless NAND gate illustrated in FIG. 1, the self-clocking dynamic logic NAND gate 400 shown in FIG. 2 does not receive any delayed clock signal CLK'. Instead, the self-clocking dynamic logic NAND gate 400 uses a dual PMOS/NMOS transistor configuration for precharging.

As shown in FIG. 2, the self-clocking dynamic NAND gate 400 includes a PMOS transistor 410 having a gate coupled to the output O from the inverter 360 of the conventional AND gate, a source coupled to the high voltage rail $V_{DD}$, and a drain coupled to an output node 420. The drain of the PMOS transistor 410 is also coupled to the drain of an NMOS transistor 430. The gate of the NMOS transistor 430 is also coupled to the output O from the inverter 360 of the conventional AND gate, and the source of the NMOS transistor 430 is coupled to a drain of an NMOS transistor 440. The gate of the NMOS transistor 440 is coupled to receive an input signal C and the source of the NMOS transistor 440 is coupled to the low voltage rail Vss.

The self-clocking dynamic logic AND gate 400 further includes a noise reduction circuit 450 which ensures performance accuracy and eliminate any possible functional errors which may be caused by noise at the input C. This noise reduction circuit 450 includes a PMOS transistor 460 which is used to provide a high noise tolerance on the incoming line, thereby preventing noise on line C from turning on the NMOS transistor 440 and leaking current through the NMOS transistors 430 and 440 in the self-clocking dynamic AND gate 400, thereby effecting the voltage at the output node 420 and causing functional errors in evaluating the input signal C.

As shown, the noise reduction circuit includes a PMOS transistor 460 having a gate coupled to receive the input signal C, a drain coupled to the high voltage rail $V_{DD}$ and a source coupled to the drain of the NMOS transistor 440 (which is also coupled to the source of the NMOS transistor 430). The PMOS transistor 460 is preferably biased to have an on/off threshold switching operating point at approximately ½ the voltage value of the voltage level at the high voltage rail $V_{DD}$. Alternatively, the PMOS transistor 460 may be biased to have an on/off threshold switching operating point at any other voltage level as deemed necessary and appropriate by the designer. When the input signal C is at a logic low voltage, the PMOS transistor 460 is turned on, thereby driving the voltage at the node 435 between the source of NMOS transistor 440 and the drain of NMOS transistor 430 to logic high voltage, thereby inhibiting the flow of any leakage current from the output node 420 through the NMOS transistors 430 and 440. The PMOS transistor 460 will remain on (thereby maintaining a high logic level at node 435) until the voltage level of the incoming input signal C is greater than one-half the voltage level of the high voltage rail (½ $V_{DD}$), at which point the voltage at node 435 will drop to the low voltage rail Vss. It is understood that this noise/leakage circuit may be used an input to the self-clocking dynamic logic circuit in order to protect against the detrimental effects of noise on the input. It is further understood that the input C to the self-clocking dynamic logic NAND gate 400, may be an input signal from an external device, the output of a traditional/conventional dynamic domino logic circuit, or the output of another self-clocking dynamic logic gate.

In operation, the voltage level at the output node 420 from the self-clocking dynamic logic NAND gate 400 is initially set to a high logic voltage assuming the voltage level at the output O from the inverter 360 is at a logic low voltage. Accordingly, initially the PMOS transistor 410 is on, the NMOS transistor 430 is off and the voltage at the output node 420 is precharged to a logic high voltage by the high voltage rail $V_{DD}$. As the voltage level at the output O from the conventional AND gate 300 is evaluated, either of two different operations may occur at the self-clocking dynamic NAND gate 400. Which operation occurs depends upon the value of the voltage level at the output O from the conventional AND gate 300 after it is evaluated and the voltage value for the input signal C.

If, after being evaluated, the output O from the conventional dynamic logic AND gate 300 is at a logic high voltage (i.e., if the input signals A and B are both logic high voltages), then NMOS transistor 430 will turn on and PMOS transistor 410 will turn off. Then, depending upon the voltage level of the input signal C to the self-clocking dynamic NAND gate 400, the voltage level at the output node 420 may be driven to a logic low voltage by the low voltage rail Vss (if the input C is a logic high voltage then the NMOS transistor 440 is turned on and this occurs). However, if the input signal C is not at a logic high voltage then the NMOS transistor 440 is not turned on and the voltage level at the output node 420 will remain at a logic high voltage level.

However, if after being evaluated, the output O from the conventional dynamic logic AND gate 300 remains at a logic low voltage—i.e. if the input signals A and B to the conventional AND gate 300 are not both at logic high voltage levels, then the PMOS transistor 410 will remain on, while the NMOS transistor 430 remains off. In this case, the voltage level at the output node 420 from the self-clocking dynamic logic NAND gate 400 will remain at a logic high voltage. Accordingly, only when the input signals A and B to the first stage conventional AND gate 300 and the input signal C to the self-clocking dynamic logic NAND gate 400 are all at logic high voltage levels will the voltage at the output node 420 from the self-clocking dynamic logic NAND gate 400 be driven to a logic low voltage level by the low voltage rail Vss. In all other cases, under all other conditions, the voltage level at the output node 420 will remain at a logic high voltage level.

As soon as the clock signal CLK input to the conventional AND gate 300 goes inactive, the transistor 310 turns on and the transistor 350 turns off. The voltage level at the output node 320 is once again precharged to a logic high voltage by the high voltage rail $V_{DD}$, and the output O from the inverter 360 of the conventional CMOS AND gate 300 is inverted toward a logic low voltage. When this happens, the NMOS transistor 430 is turned off and the PMOS transistor 410 is turned on, thereby precharging the voltage at the output node 420 of the self-clocking dynamic logic NAND gate 400 back up to the high voltage rail $V_{DD}$. It is understood that one particularly beneficial aspect of this design is that through current from the high voltage rail $V_{DD}$ to the low voltage rail Vss through transistors 410, 430 and 440 is minimized because transistors 410 and 430 are being activated/deactivated, respectively, by the same signal (the voltage signal at the output at O from the first stage).

As can be seen, the self-clocking dynamic logic NAND gate 400 illustrated in FIG. 2 does not require any connection to the clock signal and, as a result, the delay logic between the conventional AND gate 300 and the self-clocking dynamic logic NAND gate 400 is not needed. This is because the output from the self-clocking dynamic logic NAND gate 400 is driven exclusively by the voltages which are output from the previous state by using a PMOS/NMOS transistor pair for either precharging the output node of the self-clocking dynamic NAND gate 400 or evaluating the voltage level at the output node. Accordingly, the self-clocking NAND gate 400 is much easier and less expensive to implement.

Using gates designed in accordance with the self-clocking dynamic logic design of the present invention, multiple self-clocking functional gates may be coupled together in order to implement various logic functions, without requiring clock signals for each gate design. This substantially reduces power consumption, greatly increases the noise tolerance, and eliminates the need for expensive delay circuitry while still minimizing wasteful through current.

Figures 3, 4:
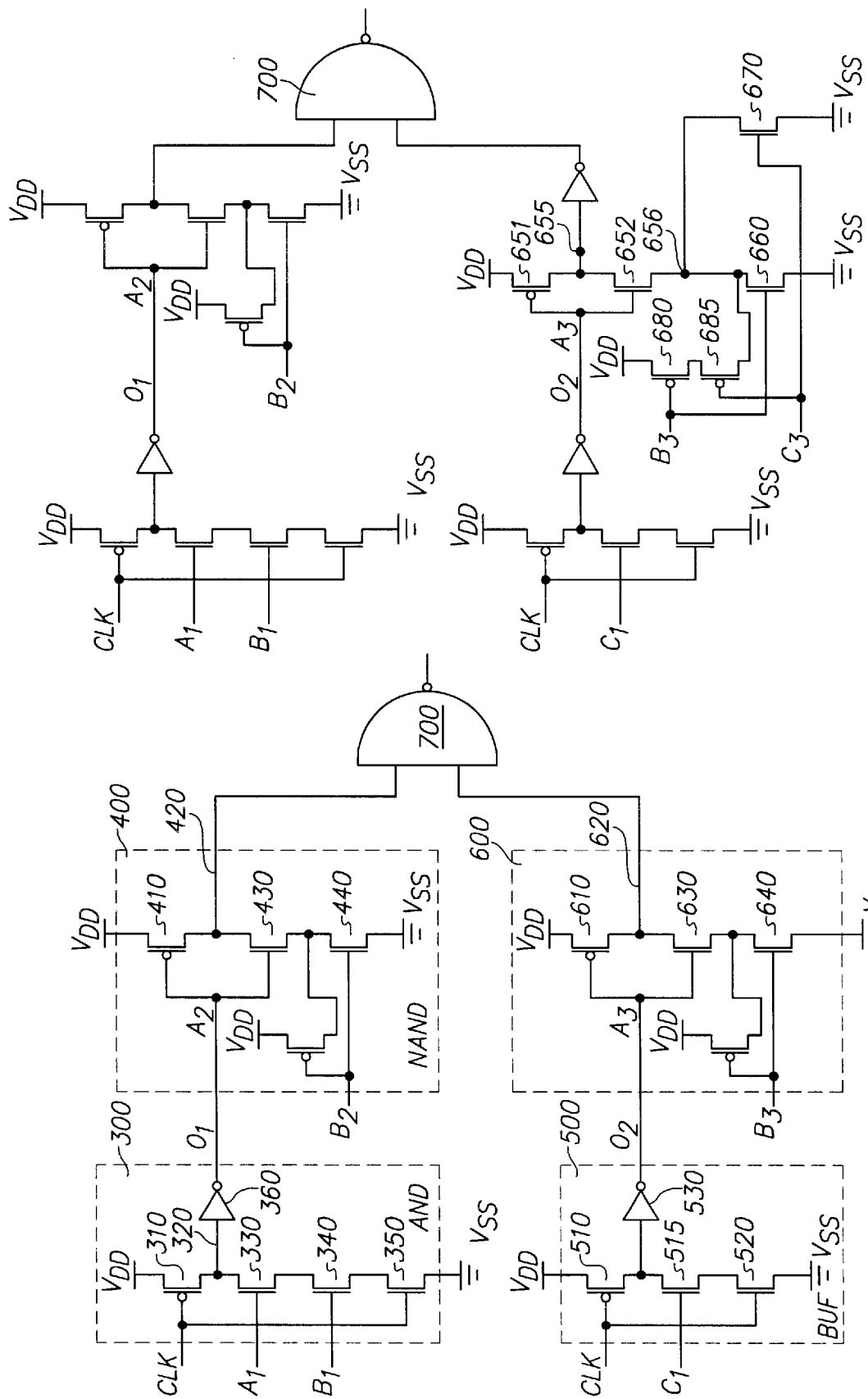
FIG. 3 illustrates a multi-stage or domino dynamic logic circuit which includes multiple self clocking dynamic logic gates combined together in accordance with a preferred embodiment of the present invention.
FIG. 4 illustrates a multi-stage or domino dynamic logic circuit which includes multiple self clocking dynamic logic gates combined together in accordance with an alternative embodiment of the present invention.

FIG. 3 illustrates one preferred embodiment of how multiple self-clocking functional logic gates designed in accordance with the present invention may be coupled in order to perform any type of various logic functions. As shown, FIG. 3 illustrates a first stage conventional dynamic logic AND gate 300 coupled to a second stage self clocking NAND gate 400 which is designed in accordance with the present invention. FIG. 3 further illustrates a first stage conventional dynamic logic buffer 500 which is further coupled to another second stage self-clocking NAND gate 600 designed in accordance with the present invention. The outputs from the two second stage self-clocking NAND gates 400 and 600 are each both coupled as inputs to a third NAND gate 700.

As shown in FIG. 3, the first stage AND gate 300 is a conventional dynamic logic AND gate 300 designed in accordance with the conventional dynamic logic principles which were previously illustrated and discussed with reference to FIG. 2. For convenience, the same reference numerals as those used in FIG. 2 are again used in FIG. 3, where appropriate. Accordingly, the conventional AND gate 300 includes a PMOS transistor 310 having a gate coupled to receive a clock signal CLK, a source coupled to a high voltage rail $V_{DD}$, and a drain coupled to an output node 320. The drain of the PMOS transistor 310 is also coupled to the drain of an NMOS transistor 330. The gate of the NMOS transistor 330 is coupled to receive an input signal A1 and the source of the NMOS transistor 330 is coupled to a drain of an NMOS transistor 340. The gate of the NMOS transistor 340 is coupled to receive an input signal B1 and the source of the NMOS transistor 340 is coupled to a drain of an NMOS transistor 350. The gate of NMOS transistor 350 is coupled to the receive the clock signal CLK and the source of the NMOS transistor 350 is coupled to a low voltage rail Vss. The output node 320 is coupled to an input of an inverter 360, having an output $O_1$. The output $O_1$ is the output from the first stage conventional dynamic logic AND gate 300.

In operation, when the clock signal CLK is inactive, then the PMOS transistor 310 is on and the NMOS transistor 350 is off. In this state, the output node 320 is precharged to a logic high voltage by the high voltage rail $V_{DD}$, and the output $O_1$ of the inverter 360 is inverted to a logic low voltage. When the clock signal CLK goes active, the PMOS transistor 310 turns off and the NMOS transistor 350 turns on. This is known as the evaluate cycle. During the evaluate cycle, when the clock signal is active, if the inputs at A1 and B1 are both at logic high voltage levels, then both NMOS transistors 330 and 340 turn on. If this occurs the voltage at the output node 320 drops to a logic low voltage level toward the voltage rail Vss and the output $O_1$ of the inverter 360 is inverted to a logic high voltage. If only one of the inputs A1 or B1 is at a logic high voltage level, while the other remains at a logic low voltage, then both NMCS transistors 330 and 340 will not turn on (only one will turn on while the other will remain off), in which case the voltage at the output node 320 will remain at a logic high voltage level and the output $O_1$ from the inverter 360 will remain at a logic low voltage level. Accordingly, only when the inputs A1 and B1 are both at logic high voltage levels will the output $O_1$ from the inverter 360 be driven to a logic high voltage level.

FIG. 3 further shows a first stage conventional dynamic logic buffer 500. The buffer is comprised of a PMOS transistor 510 and two NMOS transistors 515 and 520 which are coupled in series. The gate of the PMOS transistor 510 and the gate of one of the NMOS transistors 520 are coupled to the clock signal CLK. The gate of the other NMOS transistor 515 is coupled to receive an input signal $C_1$. The drain of PMOS transistor 510 and the drain of NMOS transistor 515 are coupled together, thereby forming an output node. The output node is coupled to the input of an inverter 530. The output from the inverter $O_2$ forms the output of the first stage conventional dynamic logic buffer 500. Basically, the output from the first stage conventional dynamic logic buffer 500 follows the input $C_1$ but is delayed or buffered until the clock signal CLK is active.

FIG. 3 also shows two different second stage self-clocking dynamic logic NAND gates 400 and 600, which are each designed in accordance with the present invention. These self-clocking dynamic logic NAND gates 400 and 600 are each arranged in parallel and their individual outputs are both coupled as inputs to another NAND gate 700. The NAND gate 700 is preferably a conventional dynamic logic NAND gate. As explained earlier, the self-clocking dynamic logic NAND gates 400 and 600 do not require any type of delayed clock signal for precharging. Instead, each of these self-clocking dynamic logic NAND gates 400 and 600 include a PMOS/NMOS transistor pair having input gates coupled to the outputs from the first stage conventional AND gate 300 and first stage conventional buffer 500, respectively (wherein the gates of the PMOS/NMOS pair in the self-clocking dynamic logic NAND gate 400 are coupled to the output $O_1$ from the first stage conventional AND gate 300 and the gates of the PMOS/NMOS pair in the self-clocking dynamic logic NAND gate 600 are coupled to the output $O_2$ from the first stage conventional CMOS buffer 500). The PMOS/NMOS transistors pairs in each of the self-clocking dynamic logic NAND gates 400 and 600 are used for precharging the respective output nodes, while ensuring that there is no through current by design.

The first self clocking dynamic logic NAND gate 400 includes a PMOS transistor 410 having a gate coupled to receive the output $O_1$ from the inverter 360 of the conventional AND gate 300 as a first input $A_2$, a source coupled to the high voltage rail $V_{DD}$, and a drain coupled to an output node 420. The drain of the PMOS transistor 410 is also coupled to the drain of an NMOS transistor 430. The gate of the NMOS transistor 430 is also coupled to receive the first input $A_2$ (which is the output $O_1$ from the inverter 360 of the conventional AND gate 300). The source of the NMOS transistor 430 is coupled to a drain of an NMOS transistor 440. A gate of the NMOS transistor 440 is coupled to receive an input signal $B_2$ and the source of the NMOS transistor 440 is coupled to the low voltage rail Vss.

In operation, the output $O_1$ from the first stage conventional CMOS AND gate 300 is initially low. At this stage, the first input $A_2$ to the first self-clocking NAND gate 400 is low, the PMOS transistor 410 is on, the NMOS transistor 430 is off, and the voltage at the output node 420 is precharged to a logic high voltage by the high voltage rail $V_{DD}$. When the output $O_1$ from the conventional AND gate 300 is evaluated, either of two different operations may occur at the first self clocking dynamic logic NAND gate 400. Which operation occurs depends upon the value of the voltage at the output $O_1$ from the conventional AND gate 300 after it is valid and the voltage level for the input signal B2.

If the output $O_1$ from the conventional AND gate 300 is driven to a logic high voltage level during the evaluate cycle (this will only occur if the input signals A1 and B1 are both at logic high voltage levels), then the first input $A_2$ is high, NMOS transistor 430 turns on, and PMOS transistor 410 turns off. Then, depending upon the voltage level at the input signal B2, the voltage level at the output node 420 of the self-clocking dynamic logic NAND gate 400 may be driven to a logic low voltage level. If the input B2 is at a logic high voltage level then NMOS transistor 440 is turned on and the voltage level at the output node 420 of the self-clocking dynamic logic NAND gate 400 will be driven to a logic low voltage level. However, if the input B2 is not a logic high voltage then the NMOS transistor 440 is not turned on and the voltage level at the output node 420 will remain at a logic high voltage level during the evaluation cycle.

If, after being evaluated, the voltage at the output $O_1$, from the conventional AND gate 300 remains at a logic low voltage—i.e. if both of the input signals A1 and B1 to the conventional AND gate 300 are not both logic high voltages, then the PMOS transistor 410 of the self-clocking dynamic logic NAND gate 400 will remain on, while the NMOS transistor 430 remains off. In this case, the voltage at the output node 420 from the first self-clocking dynamic logic NAND gate 400 will continue to be driven to a logic high voltage level by the high voltage rail $V_{DD}$. Accordingly, only when the inputs A1, B1, and B2 are all high will the output from the self-clocking dynamic logic NAND gate 400 be driven low, in all other cases it will remain high.

The second self clocking dynamic logic NAND gate 600 is arranged in parallel with the first self clocking dynamic logic NAND gate 400 and includes a PMOS transistor 610 having a gate coupled to receive an input signal $A_3$ which is coupled to the output $O_2$ from the conventional buffer 500. A source of the PMOS transistor 610 is coupled to the high voltage rail $V_{DD}$, and a drain of the PMOS transistor 610 is coupled to an output node 620. The drain of the PMOS transistor 610 is also coupled to a drain of an NMOS transistor 630. A gate of the NMOS transistor 630 is also coupled to receive the input signal $A_3$ (which is coupled to the output $O_2$ from the conventional buffer 500), and a source of the NMOS transistor 630 is coupled to a drain of an NMOS transistor 640. A gate of the NMOS transistor 640 is coupled to receive an input signal $B_3$ and a source of the NMOS transistor 640 is coupled to the low voltage rail Vss.

In operation, the output $O_2$ from the first stage conventional buffer 500 is initially low. At this stage, the input $A_3$ is also low, the PMOS transistor 610 is on, the NMOS transistor 630 is off, and the voltage at the output node 620 of the self-clocking dynamic logic NAND gate 600 is precharged to a logic high voltage level by the high voltage rail $V_{DD}$. During the evaluate cycle, when the output $O_2$ from the conventional buffer 500 is evaluated, either of two different operations may occur at the second self clocking dynamic logic NAND gate 600. Which operation occurs depends upon the value of the voltage at the output $O_2$ from the conventional buffer 500 after it is valid and the voltage level of the input signal $B_3$ to the second self-clocking dynamic logic NAND gate 600.

If the output $O_2$ from the conventional buffer 500 is high (this will only occur if the input signal $C_1$ is at a logic high voltage during the evaluate cycle), then the input $A_3$ is active, NMOS transistor 630 is turned on, and PMOS transistor 610 is turned off. Then, depending upon the voltage level of the input signal $B_3$, the voltage level at the output node 620 of the self-clocking dynamic logic NAND gate 600 may be driven to a logic low voltage level. This will occur if the input signal $B_3$ is a logic high voltage, in which case the NMOS transistor 640 will be turned on and the voltage level at the output node 620 will be driven toward the low voltage rail Vss. However, if the input signal B3 is not a logic high voltage then the NMOS transistor 640 is not turned on and the voltage level at the output node 620 of the self-clocking dynamic logic NAND gate 600 will remain at a logic high voltage.

If, after being evaluated, the output $O_2$ from the conventional buffer 500 remains at a logic low voltage level—i.e. if the input signal $C_1$ to the conventional dynamic logic buffer 500 is not a logic high voltage, then the input signal $A_3$ to the second self-clocking dynamic logic NAND gate 600 is low and PMOS transistor 610 of the self-clocking dynamic logic NAND gate 600 will remain on while the NMOS transistor 630 remains off. In this case, the voltage level at the output node 620 from the second self-clocking dynamic logic NAND gate 600 will continue to be driven to a logic high voltage by the high voltage rail $V_{DD}$. Accordingly, only when the input signals $A_3$ and $B_3$ are both logic high voltages will the voltage level at the output node 620 from the second self-clocking dynamic logic NAND gate 600 be driven to a logic low voltage level. In all other cases the voltage level at the output node 620 will remain at a logic high voltage.

It should be noted that the inputs $B_2$ and $B_3$ to the first and second self clocking dynamic logic NAND gates 400 and 600, respectively, may be external inputs, or they maybe inputs from another conventional dynamic logic gate or a self-clocking dynamic logic gate designed in accordance with the present invention and integrated on the same chip. The inputs $B_2$ and $B_3$ are each coupled to the self-clocking dynamic logic NAND gates 400 and 600 using a noise/leakage prevention circuit which inhibits any effect noise at the inputs may have on the circuit. As explained earlier with reference to FIG. 2, the noise/leakage circuit is comprised of an additional PMOS transistor which preferably has an activation point at approximately ½ the voltage level of the high voltage rail $V_{DD}$. The gate of the PMOS transistor is coupled to the particular input in question, $B_2$ or $B_3$. The source of the PMOS transistor is coupled to the high voltage rail $V_{DD}$ and the drain is coupled to the current path between the output node (nodes 420 or 620) and the low voltage rail Vss. In this way, the noise/leakage circuit prevents any through current from leaking through the current path between the output nodes and the voltage rail. This protects the self-clocking dynamic logic NAND gates 400 and 600 from the effects of noise at any of the inputs.

Finally, the voltages at the output nodes 420 and 620 from the first and second self-clocking dynamic logic NAND gates 400 and 600 are each coupled as inputs to another NAND gate 700. This NAND gate 700 maybe a conventional dynamic logic NAND gate or it may be another self-clocking dynamic logic NAND gate designed in accordance with the teachings of the present invention and not requiring any delayed clock signal.

FIG. 4 illustrates an alternative embodiment in which multiple self-clocking dynamic logic gates and conventional dynamic logic gates may be coupled together in order to perform any one of several complex logic functions. FIG. 4 is identical to the circuit shown in FIG. 3 except that the second self-clocking dynamic logic NAND gate 600 shown in FIG. 3 has been replaced with a dynamic self-clocking OAI (or-and inverse) gate 650. In the previously illustrated examples, each of the self-clocking dynamic logic circuits includes a set of NMOS transistors arranged in series, wherein each of the transistors may activate when the input signals to the gates of these transistors are active. The voltage at the output node will only change when all inputs are active—i.e. when all of the transistors in the series between the output node and the low voltage rail Vss are active. FIG. 4 illustrates an alternative embodiment wherein the NMOS transistors are arranged in parallel and the voltage at the output node may change if either input is active.

As shown in FIG. 4, the self-clocking OAI (or-and inverse) gate 650 is comprised of a PMOS transistor 651 having a source coupled to the high voltage rail $V_{DD}$, a gate coupled to receive an input signal $A_3$ and a drain coupled to an output node 655. The drain of the PMOS transistor 651 is also coupled to the drain of an NMOS transistor 652. The gate of the NMOS transistor 652 is coupled to receive the input signal $A_3$. The source of the NMOS transistor 652 is coupled to the drains of first and second NMOS transistors 660 and 670 through a common node 656. The sources of the first and second NMOS transistors 660 and 670 are each coupled to the low voltage rail Vss. The gate of the first NMOS transistor 660 is coupled to an input signal B3, while the gate of the second NMOS transistor 670 is coupled to an input signal $C_3$.

Additionally, the inputs $B_3$ and $C_3$ are each coupled to a noise/leakage prevention circuit which is coupled to the common node 656 and protects the circuit from leakage of through current which may be cause by any noise at the inputs $B_3$ or $C_3$.

The noise/leakage prevention circuit is comprised of two additional PMOS transistors 680 and 685, respectively, with input $B_3$ coupled to the gate of one of the PMOS transistors 680 and the input $C_3$ coupled to the gate of the other PMOS transistor 685. The sources of PMOS transistor 685 is coupled to the drain of PMOS transistor 680. The drain of PMOS transistor 685 is coupled to the common node 656 and the source of PMOS transistor 680 is coupled to the high voltage rail $V_{DD}$. The noise/leakage prevention circuit ensures that noise on any one of the inputs $B_3$ or $C_3$ will not falsely trigger the circuit into evaluation and result in an invalid output.

As can be seen, multiple self-clocking dynamic logic gates may be implemented serially or in parallel and combined using a sum of products design, without requiring multiple delay circuits and delayed clock signals. It is understood that alternative logic functions may be configured using the same self-clocking logic design and principles as illustrated in the accompanying figures. Each individual stage in any multi-stage circuit design may be implemented without requiring delayed clock signals.

What is claimed is:

1. A self-clocking dynamic logic gate coupled to receive an output signal from a first stage dynamic logic gate, the self-clocking dynamic logic gate comprising:
   a PMOS/NMOS transistor pair coupled between a high voltage rail and a low voltage rail for receiving the output signal which activates the PMOS transistor and deactivates the NMOS transistor when the output signal is in a first state and which activates the NMOS transistor and deactivates the PMOS transistor when the output signal is in a second state;
   at least one other transistor coupled between the PMOS/NMOS transistor pair and the low voltage rail for receiving an external input signal and activating if the external input signal is in a preselected state; and
   an output node configured between the PMOS/NMOS transistor pair, which is precharged to the high voltage rail when the PMOS transistor is activated and which is selectively discharged to the low voltage rail only if both the NMOS transistor is activated and the external input is in the preselected state, thereby activating the at least one other transistor.

2. The self-clocking dynamic logic gate of claim 1 further comprising a noise/leakage prevention circuit coupled between the at least one other transistor and the external input signal for preventing through current from leaking from the output node through the at least one other transistor and to the low voltage rail until the output signal activates the NMOS transistor and the external input signal is in the preselected state.

3. A self-clocking dynamic logic gate coupled to receive an output signal from a first stage dynamic logic gate, the self-clocking dynamic logic gate comprising:
   a PMOS/NMOS transistor pair coupled between a high voltage rail and a low voltage rail for receiving the output signal which activates the PMOS transistor and deactivates the NMOS transistor when the output signal is in a first state and which activates the NMOS transistor and deactivates the PMOS transistor when the output signal is in a second state;
   at first input transistor coupled between the PMOS/NMOS transistor pair and the low voltage rail for receiving a first external input signal and activating if the external input signal is in a preselected state;
   an output node configured between the PMOS/NMOS transistor pair which is precharged to the high voltage rail when the PMOS transistor is activated; and
   a second input transistor coupled in parallel with the first input transistor between the PMOS/NMOS transistor pair and the low voltage rail for receiving a second external input signal and activating if the second external input signal is in a preselected state and wherein the output node is selectively discharged to the low voltage rail if the NMOS transistor is activated and the either the first external input signal or the second external input signal is in the preselected state, thereby activating either the first input transistor or the second input transistor, respectively.

4. The self-clocking dynamic logic gate of claim 3 further comprising a noise/leakage prevention circuit coupled between the at least one other transistor, the second input transistor, the external input signal, and the second external input signal for preventing through current from leaking from the output node through either the at least one other transistor or the second input transistor to the low voltage rail until the output signal activates the NMOS transistor and either the external input signal or the second external input signal is in the preselected state.

5. A domino logic circuit comprising:
 a first stage dynamic logic gate for generating a first output signal; and
 a second stage self-clocking dynamic logic gate coupled to receive the first output signal from the first stage dynamic logic gate and having:
  a PMOS/NMOS transistor pair coupled between a high voltage rail and a low voltage rail for receiving the output signal which activates the PMOS transistor and deactivates the NMOS transistor when the output signal is in a first state and which activates the NMOS transistor and deactivates the PMOS transistor when the output signal is in a second state;
  at least one other transistor coupled between the PMOS/NMOS transistor pair and the low voltage rail for receiving an external input signal and activating if the external input signal is in a preselected state; and
  an output node configured between the PMOS/NMOS transistor pair, which is precharged to the high voltage rail when the PMOS transistor is activated and which is selectively discharged to the low voltage rail only if both the NMOS transistor is activated and the external input is in the preselected state, thereby activating the at least one other transistor.

6. The domino logic circuit of claim 5, wherein the first output signal from the first stage dynamic logic gate is precharged to the first state responsive to a clock signal coupled to the first stage dynamic logic gate being inactive, and further wherein the first output signal is selectively discharged to the second state responsive to the clock signal being active and at least one other first stage input coupled to the first stage dynamic logic gate being in a select state.

7. The domino logic circuit of claim 5 further comprising a noise/leakage prevention circuit coupled between the at least one other transistor and the external input signal for preventing through current from leaking from the output node through the at least one other transistor to the low voltage rail until the first output signal activates the NMOS transistor and the external input signal is in the preselected state.

8. A self-clocking dynamic logic circuit comprising:
 a plurality of first stage transistors coupled to form a first dynamic logic gate for receiving a clock signal and a plurality of first stage inputs and configured to drive a first stage output node to a first stage output voltage level, the first stage output voltage level being a predetermined high voltage level responsive to the clock signal being inactive and the first stage output voltage level being a predetermined low voltage level responsive to the clock signal being active in combination with the plurality of first stage inputs each being in a preselected state; and
 a plurality of second stage transistors coupled to form a self clocking dynamic logic gate for receiving the first stage output voltage level and a plurality of second stage inputs and configured to drive a second stage output node to a second stage output voltage level, the second stage output voltage level being the predetermined high voltage level responsive to the first stage output voltage level being in a first state, and the second stage output voltage level being the predetermined low voltage responsive to both the first stage output voltage level being in a second state and the plurality of second stage inputs each also being in a preselected state.

9. A self-clocking dynamic logic circuit comprising:
 a plurality of first stage transistors coupled to form a first dynamic logic gate for receiving a clock signal and a plurality of first stage inputs and configured to drive a first stage output node to a first stage output voltage level, the first stage output voltage level being a predetermined high voltage level responsive to the clock signal being inactive and the first stage output voltage level being a predetermined low voltage level responsive to the clock signal being active in combination with the plurality of first stage inputs each being in a preselected state;
 a plurality of second stage transistors coupled to form a self clocking dynamic logic gate for receiving the first stage output voltage level and a plurality of second stage inputs and configured to drive a second stage output node to a second stage output voltage level, the second stage output voltage level being the predetermined high voltage level responsive to the first stage output voltage level being in a first state, and the second stage output voltage level being the predetermined low voltage responsive to the first stage output voltage level being in a second state and the plurality of second stage inputs each also being in a preselected state; and
 a noise/leakage prevention circuit coupled between the plurality of second stage inputs and the self clocking dynamic logic gate for ensuring that the second stage output node remains charged to the predetermined high voltage level and preventing the leakage of any through current from the second stage output node until the first stage output voltage is in the second state and the plurality of second stage inputs are each in their preselected states.

10. A method for designing a dynamic logic circuit having at least two functional stages, the method comprising:
 coupling a first set of transistors between a high voltage source and a low voltage source, thereby forming a dynamic logic gate for driving a first output node between the high voltage source and the low voltage source;
 applying a plurality of first inputs and a clock signal to the dynamic logic gate such that a voltage measured at the first output node is driven toward the high voltage source in response to the clock signal being in a first state and such that the voltage measured at the first output node is driven toward the low voltage source in response to the clock signal being in a second state and the plurality of first inputs each being at a desired state;
 coupling a second set of transistors between the high voltage source and the low voltage source, thereby forming a self clocking logic gate for receiving the voltage measured at the first output node and driving a second output node between the high voltage source and the low voltage source; and
 applying at least one external input signal and the voltage measured at the first output node to the self clocking logic gate such that a voltage measured at the second output node is precharged to the high voltage source in response to the voltage measured at the first output node being in a first state and such that the voltage measured at the second output node is driven toward the low voltage source in response to both the voltage measured at the first output node being in a second state and the at least one external input signal being in a desired state.

11. The method of claim 10, further comprising utilizing a noise/leakage prevention circuitry coupled between the at least one external input and the self clocking logic gate in order to ensure that the voltage measured at the second output node remains precharged to the high voltage source until the voltage measured at the first output node is in the second state and the at least one external input signal is in the desired state.

12. A method for providing a plurality of logic outputs comprising:
applying input logic signals to a plurality of logic circuitry stages, each said stage having an output node;
precharging a first output node for a first logic circuitry stage in the plurality of logic circuitry stages responsive to a first clock signal orientation;
precharging each of the other output nodes for each of the remaining logic circuitry stages in the plurality of logic circuitry stages responsive to a voltage level at the output node for the preceding logic circuitry stage being in a first state;
discharging the first output node for the first logic circuitry stage in the plurality of logic circuitry stages responsive to a second clock signal orientation and the input logic signals to that first logic circuitry stage each being in a desired state; and
discharging each of the other output nodes for each of the remaining logic circuitry stages in the plurality of logic circuitry stages responsive to the voltage level at the output node for the preceding logic circuitry stage being in a second state and the input logic signals to the particular logic circuitry stage each being in desired states.

13. The method of claim 12 further comprising selectively summing the voltages at the output nodes for each stage in the plurality of logic circuitry stages in order to perform a desired logic function on the input logic signals.

14. A self-clocking dynamic logic gate coupled to receive an output signal from a first stage dynamic logic gate, the self-clocking dynamic logic gate comprising:
a PMOS/NMOS transistor pair, the transistor pair having a PMOS transistor coupled to a high voltage rail and a NMOS transistor, the transistor pair configured so that the PMOS transistor activates and enters a conductive state and the NMOS transistor deactivates and enters a nonconductive state when the output signal is in a first state and the NMOS transistor activates and enters a conductive state and the PMOS transistor deactivates and enters a nonconductive state when the output signal is in a second state;
at least one other transistor coupling the NMOS transistor of the PMOS/NMOS transistor pair to a low voltage rail, the at least one other transistor configured to activate and enter a conductive state only if an external input signal is in a preselected state; and
an output node disposed between the transistors of the PMOS/NMOS transistor pair, the output node being precharged to the high voltage rail by the PMOS transistor responsive to the output signal being in the first state and the output node being discharged to the low voltage rail by the NMOS transistor and the at least one other transistor responsive to both the output signal being in the second state and the external input signal being in the preselected state.

15. The self-clocking dynamic logic gate of claim 14 further comprising a noise/leakage prevention circuit coupled between the at least one other transistor and the external input signal for preventing through current from leaking from the output node through the at least one other transistor and to the low voltage rail until the output signal activates the NMOS transistor and the external input signal is in the preselected state.

16. A domino logic circuit comprising:
a first stage dynamic logic gate for generating a first output signal; and
a second stage self-clocking dynamic logic gate coupled to receive the first output signal from the first stage dynamic logic gate and having:
a PMOS/NMOS transistor pair, the transistor pair having a PMOS transistor coupled to a high voltage rail and a NMOS transistor, the transistor pair configured so that the PMOS transistor activates and enters a conductive state and the NMOS transistor deactivates and enters a nonconductive state when the output signal is in a first state and the NMOS transistor activates and enters a conductive state and the PMOS transistor deactivates and enters a nonconductive state when the output signal is in a second state;
at least one other transistor coupling the NMOS transistor of the PMOS/NMOS transistor pair to a low voltage rail, the at least one other transistor configured to activate and enter a conductive state only if an external input signal is in a preselected state; and
an output node disposed between the transistors of the PMOS/NMOS transistor pair, the output node being precharged to the high voltage rail by the PMOS transistor responsive to the output signal being in the first state and the output node being discharged to the low voltage rail by the NMOS transistor and the at least one other transistor responsive to both the output signal being in the second state and the external input signal being in the preselected state.

17. The domino logic circuit of claim 16, wherein the first output signal from the first stage dynamic logic gate is precharged to the first state responsive to a clock signal coupled to the first stage dynamic logic gate being inactive, and further wherein the first output signal is selectively discharged to the second state responsive to the clock signal being active and at least one other first stage input coupled to the first stage dynamic logic gate being in a select state.

18. The domino logic circuit of claim 16 further comprising a noise/leakage prevention circuit coupled between the at least one other transistor and the external input signal for preventing through current from leaking from the output node through the at least one other transistor to the low voltage rail until the first output signal activates the NMOS transistor and the external input signal is in the preselected state.

* * * * *